(12) United States Patent
Takahashi

(10) Patent No.: US 9,299,543 B2
(45) Date of Patent: Mar. 29, 2016

(54) TARGET OF SINTERED COMPACT, AND METHOD OF PRODUCING THE SINTERED COMPACT

(75) Inventor: Hideyuki Takahashi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 183 days.

(21) Appl. No.: 13/321,254

(22) PCT Filed: May 18, 2010

(86) PCT No.: PCT/JP2010/058314
§ 371 (c)(1),
(2), (4) Date: Jan. 11, 2012

(87) PCT Pub. No.: WO2010/137485
PCT Pub. Date: Dec. 2, 2010

(65) Prior Publication Data
US 2012/0097530 A1    Apr. 26, 2012

(30) Foreign Application Priority Data
May 27, 2009    (JP) .................................. 2009-127922

(51) Int. Cl.
*C23C 14/00*    (2006.01)
*C25B 11/00*    (2006.01)
(Continued)

(52) U.S. Cl.
CPC ......... *H01J 37/3414* (2013.01); *C23C 14/0623* (2013.01); *C23C 14/3414* (2013.01); *H01C 7/006* (2013.01); *H01C 17/12* (2013.01); *H01J 37/3426* (2013.01)

(58) Field of Classification Search
CPC .............. H01J 37/3417; H01J 37/3426; H01J 37/3414; C22C 12/00; C22C 28/00; C23C 14/3414

USPC ..................................................... 204/298.13
See application file for complete search history.

(56) References Cited

U.S. PATENT DOCUMENTS 7,156,964 B2    1/2007    Yahagi et al.
7,344,660 B2    3/2008    Hosono et al.
(Continued)

FOREIGN PATENT DOCUMENTS

EP    1840240 A1    10/2007
JP    05-311423 A    11/1993
(Continued)

OTHER PUBLICATIONS

Machine Translation of JP2004-323919A.*
(Continued)

*Primary Examiner* — Ibrahime A Abraham
(74) *Attorney, Agent, or Firm* — Howson & Howson LLP

(57) ABSTRACT

Provided is a target of sintered compact essentially consisting of an element of (A), an element of (B) and an element of (C) below, wherein the thermal conductivity is 2.5 W/mK or more and the oxygen concentration is 5000 ppm or more:
(A) one or more chalcogenide elements selected from S, Se, and Te;
(B) one or more Vb-group elements selected from Bi, Sb, As, P, and N; and
(C) one or more IVb-group elements or IIIb-group elements selected from Ge, Si, C, Ga, and In. Also provided is a technology enabling stable DC sputtering, and stable and high-speed sputtering by applying high electric power, by improving heat accumulation and diffusion of volatile components due to the sputtering target having high thermal conductivity and low electric resistivity.

19 Claims, 2 Drawing Sheets

(51) Int. Cl.
*C25B 13/00* (2006.01)
*H01J 37/34* (2006.01)
*C23C 14/06* (2006.01)
*C23C 14/34* (2006.01)
*H01C 7/00* (2006.01)
*H01C 17/12* (2006.01)

(56) References Cited

U.S. PATENT DOCUMENTS

| | | | |
|---|---|---|---|
| 7,484,546 B2 | 2/2009 | Yahagi et al. | |
| 7,803,209 B2 | 9/2010 | Takahashi | |
| 7,943,021 B2 | 5/2011 | Takahashi | |
| 7,947,106 B2 | 5/2011 | Takahashi | |
| 2005/0031484 A1 | 2/2005 | Nonaka et al. | |
| 2007/0297938 A1* | 12/2007 | Takahashi | 420/576 |
| 2009/0301872 A1 | 12/2009 | Yahagi et al. | |
| 2010/0206724 A1 | 8/2010 | Takahashi | |
| 2011/0017590 A1 | 1/2011 | Fukuyo et al. | |
| 2012/0279857 A1 | 11/2012 | Takahashi et al. | |

FOREIGN PATENT DOCUMENTS

| | | | | |
|---|---|---|---|---|
| JP | 11-286773 A | 10/1999 | | |
| JP | 2000-026960 A | 1/2000 | | |
| JP | 2001-098366 A | 4/2001 | | |
| JP | 2001-342505 A | 12/2001 | | |
| JP | 2001-342559 A | 12/2001 | | |
| JP | 2003-055758 A | 2/2003 | | |
| JP | 2004-162109 A | 6/2004 | | |
| JP | 2004-311729 A | 11/2004 | | |
| JP | 2004323919 A | * 11/2004 | | C22C 28/00 |
| JP | 2005-023350 A | 1/2005 | | |
| JP | 4172015 B2 | 10/2008 | | |
| WO | 2009/116213 A1 | 9/2009 | | |

OTHER PUBLICATIONS

Machine Translation of JP2005-023350.*
One Page English Abstract of JP 2000-265262 A, Sep. 26, 2000.
One Page English Abstract of JP 2001-123266 A, May 8, 2001.
One Page English Abstract of JP 03-180468 A, Aug. 6, 1991.
One Page English Abstract of JP 10-081962 A, Mar. 31, 1998.
One Page English Abstract of JP 2001-123267 A, May 8, 2001.
D. Dimitrov et al., "The Influence of Oxygen and Nitrogen Doping on GeSbTe Phase-Change Optical Recording Media Properties", Materials Science & Engineering B, vol. 107, No. 2, pp. 107-112, Mar. 15, 2004.

* cited by examiner

TARGET OF SINTERED COMPACT, AND METHOD OF PRODUCING THE SINTERED COMPACT

BACKGROUND OF THE INVENTION

The present invention relates to a target of sintered compact containing a Vb-group element (A) and a chalcogenide element (B), or containing the elements (A) and (B) and additionally a IVb-group element and/or a IIIb-group element (C), in which the electric resistivity of the sintered compact is reduced, as well as to a method of producing such a target. Note that this material containing a Vb-group element (A) and a chalcogenide element (B), or containing the elements (A) and (B) and additionally a IVb-group element and/or a IIIb-group element (C), in which the electric resistivity of the sintered compact is reduced, is hereinafter abbreviated as the "Ge—Sb—Te-based material".

In recent years, a thin film formed from the Ge—Sb—Te-based material is being used as a material for phase-change recording; that is, as a medium for recording information by using phase transformation.

As a method of forming this thin film of the Ge—Sb—Te-based alloy material, it is standard to use a means generally referred to as a physical vapor deposition method such as the sputtering method. In particular, the thin film is often formed using the magnetron sputtering method from the perspective of operability and film stability.

Formation of films by the sputtering method is performed by physically colliding positive ions such as Ar ions to a target located on a cathode side, ejecting materials configuring the target with the collision energy, and laminating a film similar in composition to the target material onto the anode-side substrate that is located opposite to the target.

The coating method based on the sputtering method has a feature that enables to form films of various thicknesses; for instance, from a thin film of angstrom units to a thick film of several ten μm; with a stable deposition rate by adjusting the processing time, power supply and the like.

Attention has been conventionally focused on inhibiting the generation of particles in order to stably and efficiently perform sputtering, and a high-density sintered compact having a relative density of approximately 98.8% has been prepared by sintering, via hot press, the raw powder having high purity and a prescribed grain size.

As a sintered compact of the Ge—Sb—Te-based material, known is a sintered compact that is obtained by appropriately combining a chalcogenide element (S, Se, Te), a Vb-group element (Bi, Sb, As, P, N), a IVb-group element (Pb, Sn, Ge, Si, C) and an additive element (Ag, Au, Pd, Pt, B, Al, Ti, Zr, Zn) to be sintered.

Nevertheless, these materials generally have low thermal conductivity and low electric conductivity. For example, with a $Ge_2Sb_2Te_5$ alloy that is generally used as a material for a phase-change memory, there have been only those having electric resistivity exceeding 0.26 mΩ·cm.

A target produced from this kind of sintered compact with low thermal conductivity and low electric conductivity often entails such problems particularly caused by low thermal conductivity where components with high vapor pressure become volatilized and particles are generated easily due to the heat generated by the sputtering being accumulated within the target.

In addition, there is a problem such as charge-up with DC sputtering, and it is necessary to take measures such as using the pulsed DC sputtering technique to perform the deposition. Still, it is impossible to completely eliminate drawbacks such as arcing caused by the charge-up, and there is a problem in that the deposition efficiency is low.

As conventional technology, known is a technique of increasing the concentration of oxygen contained in the film in order to deposit a GeSbTe film with high electric resistivity (refer to Patent Document 1). In Patent Document 1, a Ge—Sb—Te target is prepared, and the oxygen partial pressure is adjusted so as to form, by DC magnetron sputtering, a phase-change recording film with high electric resistance in which the oxygen in the film is increased to 0.1 to 15%.

With the oxygen during the deposition, $Ar+O_2$ atmosphere is used as the sputtering atmosphere, and oxygen is introduced into the film therefrom. However, since oxygen is consumed during the deposition process, there is a problem in that the amount of oxygen will fluctuate during the deposition unless the amount of oxygen gas in the sputtering atmosphere is strictly controlled. As a technique for dealing with this problem, for example, proposed is to produce a sputtering target to which oxygen has been preliminarily introduced (refer to Patent Document 2).

In addition, proposed is a Ge—Sb—Te-based sputtering target containing 0.3 to 1.5% of oxygen in order to improve the resistance to sputtering cracks so that the target will not crack even when sputtering is performed with high power (refer to Patent Document 3).

The simple introduction of oxygen is one index with respect to the point that the electric resistivity and resistance to sputtering cracks will change, but it is considered that the thermal resistance and electric resistance will increase due to ceramization (oxidation), and the same effect applies to Patent Document 1. Thus, this technology is heading in a direction that is opposite to improving the electric conduction and thermal conduction, and cannot be used as a technical guideline for increasing the thermal conductivity and electric conductivity of the target in order to perform stable DC sputtering.

[Patent Document 1] Japanese Laid-Open Patent Publication No. 2004-311729
[Patent Document 2] Japanese Laid-Open Patent Publication No. H11-286773
[Patent Document 3] Japanese Laid-Open Patent Publication No. 2004-323919

SUMMARY OF INVENTION

This invention enables to obtain a target that is free from heat accumulation and diffusion of volatile components by increasing the thermal conductivity and electric conductivity of the target. An object of this invention is to provide a target of sintered Ge—Sb—Te-based material, which enables stable DC sputtering, and high-speed sputtering by applying high power, and enables reduction of the generation of arcing during sputtering and reduction of the generation of particles; as well as to provide a production method thereof and a deposition method via sputtering.

As a result of intense study to achieve the foregoing object, the present inventors discovered that the foregoing problems can be resolved by subjecting the raw powder for the sintered compact to oxidation treatment at a predetermined concentration, sintering this oxidized raw powder via high-vacuum hot press in a reduction atmosphere under specific process conditions, forming crystal phases of low resistance at the grain boundary, and thereby causing the sintered compact to be of low resistance.

Based on the foregoing discovery, the present invention provides:

1. A target of sintered compact essentially consisting of an element of (A), an element of (B) and an element of (C) below, wherein the thermal conductivity is 2.5 W/mK or more and the oxygen concentration is 5000 ppm or more:
(A) one or more chalcogenide elements selected from S, Se, and Te;
(B) one or more Vb-group elements selected from Bi, Sb, As, P, and N; and
(C) one or more IVb-group elements or IIIb-group elements selected from Ge, Si, C, Ga, and In.

The present invention additionally provides:

2. The target of sintered compact according to 1 above, wherein the oxygen concentration is 5000 ppm or more and less than 30000 ppm; and
3. The target of sintered compact according to 1 above, wherein the oxygen concentration is 5000 ppm or more and 15000 ppm or less.

The present invention further provides:

4. The target of sintered compact according to any one of 1 to 3 above, wherein the element of (A) is Te, the element of (B) is Sb, the element of (C) is Ge, the composition is $Ge_{22.2}Sb_{22.2}Te_{55.6}$ (at %), and the electric resistivity is 0.30 mΩ·cm or less;
5. The target of sintered compact according to 4 above, wherein the electric resistivity is 0.26 mΩ·cm or less; and
6. The target of sintered compact according to 4 above, wherein the electric resistivity is 0.24 mΩ·cm or less.

The present invention also provides:

7. The target of sintered compact according to 4 above, wherein the electric resistivity is 0.22 mΩ·cm or less;
8. The target of sintered compact according to any one of 1 to 7 above, wherein the thermal conductivity is 3.0 W/mK or more;
9. The target of sintered compact according to any one of 1 to 7 above, wherein the thermal conductivity is 3.2 W/mK or more; and
10. The target of sintered compact according to any one of 1 to 7 above, wherein the thermal conductivity is 3.4 W/mK or more.

The present invention additionally provides:

11. A deposition method to form a film on a substrate by DC sputtering with the use of the target of sintered compact according to any one of 1 to 10 above.

Conventionally, when preparing a target of sintered compact by using a chalcogenide element (A) and a Vb-group element (B), or using the elements (A) and (B) and additionally a IVb-group element or a IIIb-group element (C) as the raw powder, for instance, with a Ge22.2-Sb22.2-Te55.6 at % sintered compact as the representative example thereof, it was possible to only obtain a sintered compact with electric resistivity exceeding 0.30 mΩ·cm and with thermal conductivity of less than 2.5 W/mK, and DC sputtering could not be adopted for sputtering deposition. This leads to the generation of arcing and the generation of particles. Moreover, since the thermal conductivity is low as described above, heat tends to accumulate within the target. Thus, components with high vapor pressure become volatilized, and it was not possible to avoid the variation in the deposited film composition associated with the progress of sputtering and the generation of particles caused by the volatile components. Contrary to the results shown in the prior arts, the composition of raw material for producing the sintered compact, and the processing and sintering conditions are improved in the present invention, and the mechanism is not necessarily clarified today but low-resistance crystal phases or low-resistance fine grains are thereby formed in the grain boundary. It has been found that the electric conductivity and thermal conductivity of the sintered compact can be obtained by making the sintered compact as a whole be of low-resistivity which is due to forming low-resistivity crystalline phases or low-resistivity fine grains at boundaries of sintered grains. Thereby, the present invention has achieved a target of sintered compact having thermal conductivity of 2.5 W/mK or more. Moreover, the present invention has achieved 0.30 mΩ·cm or less as to electric resistivity.

As a result of using the target of the present invention capable of increasing the thermal conductivity and reducing the electric resistance, it is possible to obtain a superior effect of enabling stable DC sputtering, eliminating heat accumulation and diffusion of volatile components, enabling high-speed sputtering by applying high power, and reducing the generation of arcing and the generation of particles during sputtering.

DETAILED DESCRIPTION OF THE INVENTION

The fundamental components of the target of sintered compact according to the present invention are (A) one or more chalcogenide elements selected from S, Se, and Te; (B) one or more Vb-group elements selected from Bi, Sb, As, P, and N; and (C) one or more IVb-group elements or IIIb-group elements selected from Ge, Si, C, Ga, and In.

As a preferred target material, Te can be used as the chalcogenide element, Sb can be used as the Vb-group element, and Ge can be used as the IVb-group element (GST target). In the ensuing explanation, for the ease of understanding and explanation, a GST target will mainly be explained as the representative example. However, it should be understood that the present invention is not limited to this GST target.

The foregoing target can contain one or more elements among Ag, Al, Au, B, O, P, Pd, Pt, S, Ti, Zn, and Zr as a dopant. Normally, 10 to 90 at % of the chalcogenide element, 10 to 90 at % of the Vb-group element, 5 to 30 at % of the IVb-group element or IIIb-group element, and 0.5 to 2 at % of the dopant are used.

Although Te is indicated as the representative example of the foregoing chalcogenide element, S and/or Se can be simultaneously added in addition to Te. In addition to Sb as the Vb-group element, Bi, As, P, and/or N can be simultaneously added. Also, in addition to Ge as the IVb-group element, C, Si, Sn, and/or Pb can be simultaneously added.

A considerable feature of the target of sintered compact according to the present invention is to be able to achieve thermal conductivity of 2.5 W/mK or more, 3.0 W/mK or more, 3.2 W/mK or more, and even 3.4 W/mK or more; and achieve electric resistivity of 0.30 mΩ·cm or less, 0.26 mΩ·cm or less, 0.24 mΩ·cm or less, and even 0.22 mΩ·cm or less.

The high thermal conductivity and low electric resistivity of the low-resistance target of sintered compact according to the present invention can be achieved by adjusting the component composition and oxygen concentration.

Figure 1:
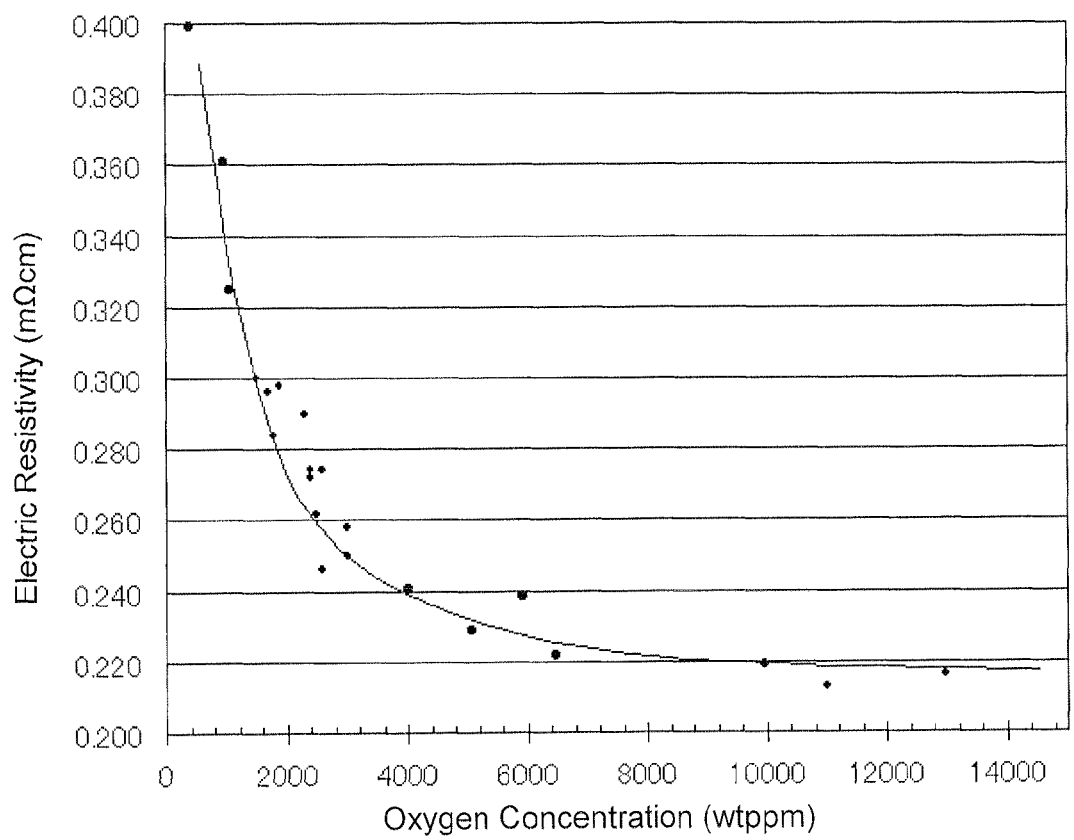
[FIG. 1] This is a diagram showing the correlation between oxygen concentration and electric resistivity of the sintered compact.
Figure 2:
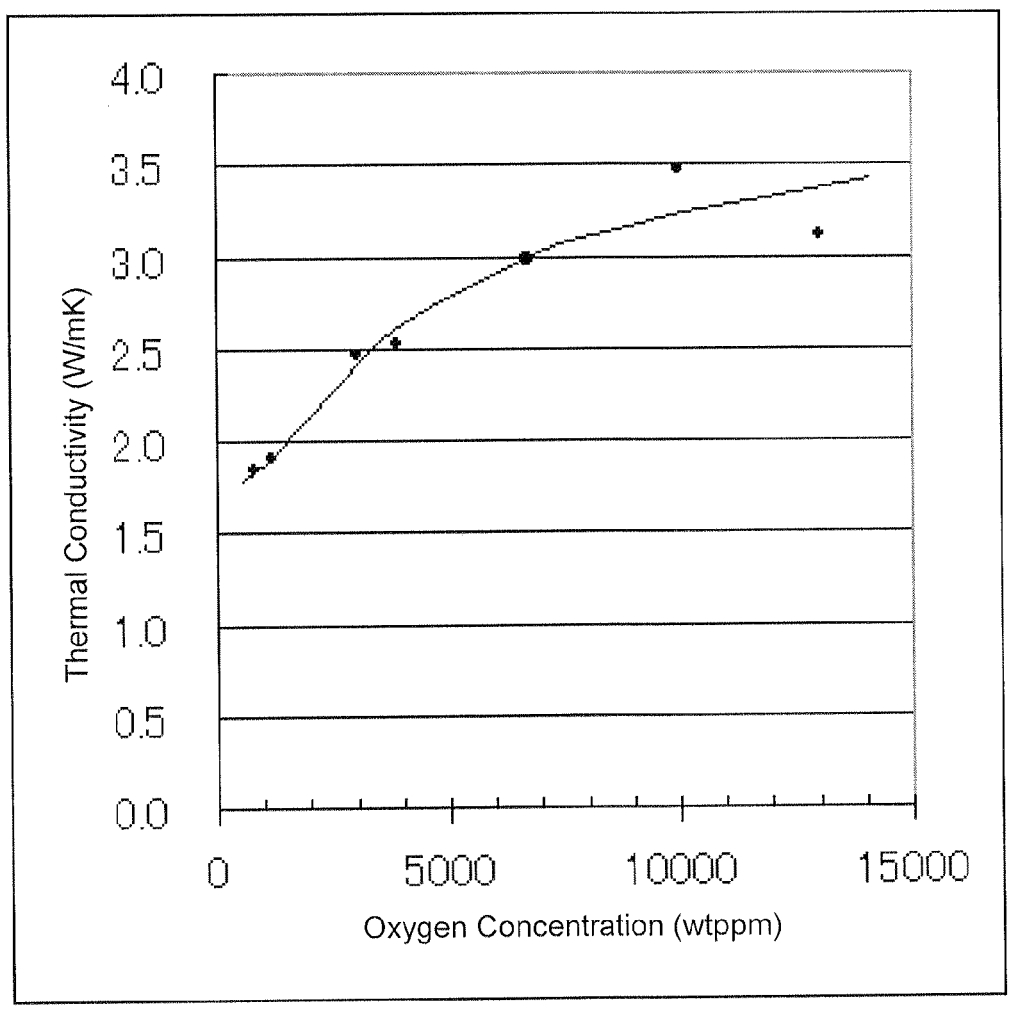
[FIG. 2] This is a diagram showing the correlation between oxygen concentration and thermal conductivity of the sintered compact.

The correlation between oxygen concentration and electric resistivity of the sintered compact having the foregoing composition is shown in FIG. 1, and the correlation between oxygen concentration and thermal conductivity is shown in FIG. 2. As shown in FIG. 1, it was discovered that the electric resistivity decreases drastically when the oxygen concentration is 400 to 5000 wtppm. In addition, the decrease in electric resistivity was observed along with the rise in oxygen concentration.

In FIG. 1 and FIG. 2, the upper limit of the oxygen concentration is only indicated up to 14000 wtppm to 15000 wtppm, but the rise in thermal conductivity and the decrease in electric resistivity basically reach an almost saturation point, and these values will stay there until the oxygen concentration is less than 30000 wtppm. When the oxygen concentration increases any further, the density of the sintered compact considerably decreases due to the deterioration of sinterability, and it results in the deterioration of thermal conductivity and increase of electric resistance.

FIG. 1 shows that the oxygen concentration should be desirably 5000 wtppm or more in order to achieve electric resistivity of 0.26 mΩ·cm or less. In addition, when the oxygen concentration was 10000 wtppm or more, it was possible to achieve electric resistivity of 0.22 mΩ·cm or less.

Moreover, as shown in FIG. 2, the thermal conductivity increased when the oxygen concentration is 1000 to 5000 wtppm. In order to achieve thermal conductivity of 2.5 W/mK or more, it can be understood that the oxygen concentration is preferably 5000 wtppm or more. In addition, when the oxygen concentration was 10000 wtppm or more, it was possible to achieve thermal conductivity of 3.2 W/mK or more.

As described in Patent Document 1, it is normal that oxides of the constituents are formed and the resistivity increases when oxygen is introduced into the target. Thus, for example, with a Sb—Te-based target or a Ge—Sb—Te-based target, the introduction of oxygen has normally been avoided since a nonconductor such as $GeO_2$ or $SbO_2$ is formed, but it was discovered that the reverse phenomenon would take place.

It is considered that the causes of such a phenomenon include the influence exerted by the composition of Ge—Sb—Te alloy and the semiconductivity of the oxides or suboxides thereof, and the new formation of low-resistance crystal phases around the crystal grains. The present invention confirmed this phenomenon, which was not considered conventionally, through numerous experiments.

This tendency was confirmed with $Ge_{22.2}Sb_{22.2}Te_{55.6}$ which is indicated as the representative example in this specification, but it was also confirmed with other compositions and even with different alloy systems. Accordingly, it should be easy to understand that this technology is not limited to $Ge_{22.2}Sb_{22.2}Te_{55.6}$.

The causes for forming low-resistance crystal phases or the like around the crystal grains could be attributed to the suboxides such as $GeO_x$ formed around the crystal grains in a region where the oxygen concentration is slightly high, and the disruption of composition balance occurred thereby.

Note that, with the tendency of the electric resistivity decreasing along with the oxygen concentration increasing, the electric resistivity will be 0.40 mΩ·cm or less when the oxygen concentration is less than 30000 wtppm (5%), but the electric resistivity will increase when the oxygen concentration exceeds the foregoing value. When the oxygen concentration is less than 30000 wtppm, it is considered that Ge-Ox suboxide, which deviates from the stoichiometric composition, exists in an oxygen deficient state, and is therefore of a low resistance state.

The target of sintered compact with low electric resistivity obtained as described above enables film formation on a substrate via DC sputtering. Normally, in the foregoing case, a film having the same component composition as the target can be formed on the substrate unless the sputtering conditions are particularly changed. Nevertheless, it is also possible to change the sputtering conditions to change the composition of the deposited film. This can be adjusted according to the purpose of the deposition.

A DC magnetron sputtering device can obviously be used in this sputtering method, but it goes without saying that RF sputtering or other sputtering methods can also be used as necessary.

Sputtering is generally performed in an argon gas atmosphere, but it is also possible to perform sputtering by introducing reactive gas such as oxygen gas or nitrogen gas into the argon gas as necessary. It should be easy to understand that the present invention does not deny the above.

Upon manufacturing the foregoing target, in order to obtain a target with the intended component composition, electric conductivity, and thermal conductivity; the raw powders are mixed within a range where the chalcogenide element is 10 to 90 at %, the Vb-group element is 10 to 90 at %, the IVb-group element is 5 to 30 at %, and the dopant is 0.5 to 2 at %, heat treatment is preferably performed in the atmosphere or oxygen atmosphere so that the oxygen content is 5000 wtppm or more and less than 30000 wtppm, and the mixed powder is hot pressed under the conditions that satisfy the following formula: P (pressure)≤{Pf/(Tf−$T_0$)}×(T−$T_0$)+ $P_0$ (Pf: final achieving pressure, Tf: final achieving temperature, $P_0$: atmospheric pressure, T: heating temperature, $T_0$: room temperature, temperatures are expressed in degrees Celsius).

As a result of adjusting the foregoing manufacturing conditions, it is possible to manufacture, for example, a Ge—Sb—Te-based sintered compact with thermal conductivity of 2.5 W/mK or more, 3.0 W/mK or more, 3.2 W/mK or more, and even 3.4 W/mK or more, and with electric resistivity of 0.30 mΩ·cm or less, 0.26 mΩ·cm or less, 0.24 mΩ·cm or less, and even 0.22 mΩ·cm or less.

In order to obtain the foregoing effects, the specific surface area BET of the raw powder is preferably 0.6 $m^2$/g or more, and it is imperative that the hot press is performed under the foregoing conditions. The foregoing manufacturing conditions have been confirmed as the preferred manufacturing conditions of the target of the present invention, but the method for preparation of raw powders and the sintering method other than the following can also be used so as long as the characteristics of the target are not lost. The present invention also covers those.

With the structure of the sintered target obtained thereby, it is possible to obtain, for example, a Ge—Sb—Te-based sintered compact having an average grain size of 1 μm to 100 μm, a deflecting strength of 40 MPa or more, a relative density of 98% or higher, and a standard deviation of the in-plane density of the sintered compact surface of less than 1%.

Although the improvement of the deflecting strength and relative density is not a direct objective of the present invention, these are preferable effects that are additionally obtained. It is thereby possible to prevent the target from cracking even when power of 2000 W or more is applied, and yield the effect of inhibiting the generation of abnormal discharge and the generation of particles.

Accordingly, the target of sintered compact with high thermal conductivity and electric conductivity according to the present invention can prevent the volatilization of components with high vapor pressure caused by the accumulation of generated heat, and enables DC sputtering and the increase in the deposition efficiency; and also the generation of particles caused by stripping of a film redeposited on the target can be effectively inhibited. Consequently, it is possible to effectively inhibit the instability of film composition, and the generation of particles, abnormal discharge, and nodules during the foregoing sputtering process.

EXAMPLES

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

The following Examples were performed under the following test conditions.
(Conditions of Ion Plating with Use of Raw Powder)
Degree of vacuum: $1\times10^{-5}$ Pa or less
Ionization voltage: 40 V
Work voltage: −500 V
Current value: 200 mA
(Measurement Method of Electric Resistivity of Target Material)
Four-terminal method
(Measurement Method of Thermal Conductivity of Target Material)
Laser flash method
(Measurement Method of Oxygen Content of Raw Powder)
Inert gas fusion-infrared absorption method Example 1

The raw powders of Te, Sb and Ge respectively having a purity of 99.999% (5N) excluding gas components were mixed and melted to obtain a composition of $Ge_{22.2}Sb_{22.2}Te_{55.6}$ (at %), and slowly cooled in a furnace to prepare a cast ingot.

The raw materials of the respective elements were subject to acid cleaning and deionized water cleaning prior to the melting process in order to sufficiently eliminate impurities remaining particularly on the surface.

Consequently, a high-purity $Ge_{22.2}Sb_{22.2}Te_{55.6}$ ingot maintaining a purity of 99.999% (5N) was obtained. Subsequently, the high-purity $Ge_{22.2}Sb_{22.2}Te_{55.6}$ ingot was pulverized with a ball mill to prepare raw powder having an average grain size of approximately 30 µm, and a maximum grain size of approximately 90 µm (the values were round to the 10).

This raw powder was oxidized by being subject to heat treatment for 6 hours at 350° C. in the atmosphere (oxygen concentration: 20.90%). The oxygen content was 5000 wtppm.

Subsequently, this raw powder was filled in a graphite die having a diameter of 400 mm, and processed by setting a final rising temperature of 600° C. at a temperature rising rate of 5° C./min, and a final pressing pressure of 150 kgf/cm² in a vacuum atmosphere of $8\times10^{-2}$ Pa or less in order to prepare an intermediate sintered compact of $Ge_{22}Sb_{22}Te_{56}$. The obtained intermediate sintered compact having a diameter of 400 mm was additionally subject to HIP treatment under the condition of $P_{HIP}=1000$ kgf/cm².

The obtained sintered compact was subject to cutting work to obtain a target material. The thermal conductivity of the target material manufactured as described above was 3.1 W/mK, and the electric resistivity was 0.26 mΩ·cm.

The foregoing target material was bonded with a copper alloy backing plate, and the obtained sputtering target had favorable bondability. In addition, favorable bondability was also confirmed when the foregoing target material was bonded with an aluminum alloy backing plate.

DC (direct current) magnetron sputtering was performed using this sputtering target. The DC (direct current) magnetron sputtering could be performed easily, and the sputtering rate was high. Even when power of 2000 W, which is greater than conventionally, was applied, the arcing generation rate was less than once per minute, and the particle generation rate was 18 particles or less and extremely low. Moreover, there was no occurrence of grain dropping or generation of nodules caused by micropores during sputtering.

Example 2

The same raw powder as Example 1 was used up to the pulverization process, and this raw powder was oxidized by being subject to heat treatment for 12 hours at 350° C. in the atmosphere (oxygen concentration: 20.90%). The oxygen content of the raw powder was 7500 wtppm. The subsequent sintering conditions and final HIP treatment conditions were the same as Example 1 for manufacturing a sputtering target.

The thermal conductivity of the target material manufactured as described above was 3.2 W/mK, and the electric resistivity was 0.24 mΩ·cm. This target material was bonded with a copper alloy backing plate to obtain a sputtering target.

DC (direct current) magnetron sputtering was performed using this sputtering target. The DC (direct current) magnetron sputtering could be performed even easier than Example 1, and the sputtering rate increased.

The arcing generation rate was less than once per minute and the particle generation rate was 20 particles or less. The particle generation rate was extremely low, and there was no occurrence of grain dropping or generation of nodules caused by micropores during sputtering. Accordingly, the DC (direct current) magnetron sputtering becomes easier to perform pursuant to the increase of oxygen, and the deposition rate also tends to increase.

Example 3

The same raw powder as Example 1 was used up to the pulverization process, and this raw powder was subject to heat treatment for 24 hours at 350° C. in a high oxygen atmosphere (oxygen concentration in the atmosphere was increased so as to achieve an oxygen concentration of 50%). The oxygen content of the raw powder was 10000 wtppm.

The subsequent sintering conditions and final HIP treatment conditions were the same as Example 1 for manufacturing a sputtering target. The thermal conductivity of the target material manufactured as described above was 3.5 W/mK, and the electric resistivity was 0.22 mΩ·cm. This target material was bonded with a copper alloy backing plate to obtain a sputtering target.

DC (direct current) magnetron sputtering was performed using this sputtering target. The DC (direct current) magnetron sputtering could be performed even easier than Example 1 and Example 2, and the sputtering rate was extremely high.

The arcing generation rate was less than once per minute and the particle generation rate was 15 particles or less. The particle generation rate was extremely low, and there was no occurrence of grain dropping or generation of nodules caused by micropores during sputtering.

Example 4

The same raw powder as Example 1 was used up to the pulverization process, and this raw powder was subject to heat treatment for 48 hours at 350° C. in a high oxygen atmosphere (oxygen concentration in the atmosphere was increased so as to achieve an oxygen concentration of 50%). The oxygen content of the raw powder was 15000 wtppm.

The subsequent sintering conditions and final HIP treatment conditions were the same as Example 1 for manufacturing a sputtering target. The thermal conductivity of the target material manufactured as described above was 3.7 W/mK, and the electric resistivity was 0.21 mΩ·cm. This target material was bonded with a copper alloy backing plate to obtain a sputtering target.

DC (direct current) magnetron sputtering was performed using this sputtering target. The DC (direct current) magnetron sputtering could be performed even easier than Example 1, Example 2 and Example 3, and the sputtering rate was extremely high.

The arcing generation rate was less than once per minute and the particle generation rate was 13 particles or less. The particle generation rate was extremely low, and there was no occurrence of grain dropping or generation of nodules caused by micropores during sputtering.

Example 5

The raw powders of In, Sb and Te respectively having a purity of 99.999% (5N) excluding gas components were mixed and melted to obtain a composition of $In_{33.3}Sb_{22.2}Te_{44.5}$ (at %), and slowly cooled in a furnace to prepare a cast ingot. The raw materials of the respective elements were subject to acid cleaning and deionized water cleaning prior to the melting process in order to sufficiently eliminate impurities remaining particularly on the surface.

Consequently, a high-purity $In_{33.3}Sb_{22.2}Te_{44.5}$ ingot maintaining a purity of 99.999% (5N) was obtained. Subsequently, the high-purity $In_{33.3}Sb_{22.2}Te_{44.5}$ ingot was pulverized with a ball mill to prepare raw powder having an average grain size of approximately 30 µm, and a maximum grain size of approximately 90 µm (the values were round to the 10).

This raw powder was oxidized by being subject to heat treatment for 6 hours at 300° C. in the atmosphere (oxygen concentration: 20.90%). The oxygen content was 5000 wtppm.

Subsequently, this raw powder was filled in a graphite die having a diameter of 400 mm, and processed by setting a final rising temperature of 600° C. at a temperature rising rate of 5° C./min, and a final pressing pressure of 150 kgf/cm² in a vacuum atmosphere of $8 \times 10^{-2}$ Pa or less in order to prepare an intermediate sintered compact of $In_{33.3}Sb_{22.2}Te_{44.5}$. The obtained intermediate sintered compact having a diameter of 400 mm was additionally subject to HIP treatment under the condition of $P_{HIP}=1000$ kgf/cm².

The obtained final sintered compact was subject to cutting work to obtain a target material. The thermal conductivity of the target material manufactured as described above was 2.8 W/mK, and the electric resistivity was 0.33 mΩ·cm.

The foregoing target material was bonded with a copper alloy backing plate, and the obtained sputtering target had favorable bondability. In addition, favorable bondability was also confirmed when the foregoing target material was bonded with an aluminum alloy backing plate.

DC (direct current) magnetron sputtering was performed using this sputtering target. The DC (direct current) magnetron sputtering could be performed easily, and the sputtering rate was high. Even when power of 2000 W, which is greater than conventionally, was applied, the arcing generation rate was less than once per minute, and the particle generation rate was 25 particles or less and extremely low. Moreover, there was no occurrence of grain dropping or generation of nodules caused by micropores during sputtering.

Example 6

The same raw powder as Example 5 was used up to the pulverization process, and this raw powder was oxidized by being subject to heat treatment for 12 hours at 300° C. in the atmosphere (oxygen concentration: 20.90%). The oxygen content of the raw powder was 7500 wtppm. The subsequent sintering conditions and final HIP treatment conditions were the same as Example 5 for manufacturing a sputtering target.

The thermal conductivity of the target material manufactured as described above was 3.0 W/mK, and the electric resistivity was 0.32 mΩ·cm. This target material was bonded with a copper alloy backing plate to obtain a sputtering target.

DC (direct current) magnetron sputtering was performed using this sputtering target. The DC (direct current) magnetron sputtering could be performed even easier than Example 5, and the sputtering rate increased.

The arcing generation rate was less than once per minute and the particle generation rate was 23 particles or less. The particle generation rate was extremely low, and there was no occurrence of grain dropping or generation of nodules caused by micropores during sputtering. Accordingly, the DC (direct current) magnetron sputtering becomes easier to perform pursuant to the increase of oxygen, and the deposition rate also tends to increase.

Example 7

The same raw powder as Example 5 was used up to the pulverization process, and this raw powder was subject to heat treatment for 24 hours at 300° C. in a high oxygen atmosphere (oxygen concentration in the atmosphere was increased so as to achieve an oxygen concentration of 50%). The oxygen content of the raw powder was 10000 wtppm.

The subsequent sintering conditions and final HIP treatment conditions were the same as Example 5 for manufacturing a sputtering target. The thermal conductivity of the target material manufactured as described above was 3.2 W/mK, and the electric resistivity was 0.29 mΩ·cm. This target material was bonded with a copper alloy backing plate to obtain a sputtering target.

DC (direct current) magnetron sputtering was performed using this sputtering target. The DC (direct current) magnetron sputtering could be performed even easier than Example 5 and Example 6, and the sputtering rate was extremely high.

The arcing generation rate was less than once per minute and the particle generation rate was 18 particles or less. The particle generation rate was extremely low, and there was no occurrence of grain dropping or generation of nodules caused by micropores during sputtering.

Example 8

The same raw powder as Example 5 was used up to the pulverization process, and this raw powder was subject to heat treatment for 48 hours at 300° C. in a high oxygen atmosphere (oxygen concentration in the atmosphere was increased so as to achieve an oxygen concentration of 50%). The oxygen content of the raw powder was 15000 wtppm.

The subsequent sintering conditions and final HIP treatment conditions were the same as Example 5 for manufacturing a sputtering target. The thermal conductivity of the target material manufactured as described above was 3.4

W/mK, and the electric resistivity was 0.27 mΩ·cm. This target material was bonded with a copper alloy backing plate to obtain a sputtering target.

DC (direct current) magnetron sputtering was performed using this sputtering target. The DC (direct current) magnetron sputtering could be performed even easier than Example 5, Example 6 and Example 7, and the sputtering rate was extremely high.

The arcing generation rate was less than once per minute and the particle generation rate was 19 particles or less. The particle generation rate was extremely low, and there was no occurrence of grain dropping or generation of nodules caused by micropores during sputtering.

Reference Example 1

The raw powders of Te, Sb and Ge respectively having a purity of 99.999% (5N) excluding gas components were mixed to obtain a composition of $Ge_{22.2}Sb_{22.2}Te_{55.6}$ (at %), 0.5 at % of Ag was additionally mixed as a dopant and melted, and the melted material was slowly cooled in a furnace to prepare a cast ingot. The raw materials of the respective elements were subject to acid cleaning and deionized water cleaning prior to the melting process in order to sufficiently eliminate impurities remaining particularly on the surface.

Consequently, a high-purity Ag-doped $Ge_{22.2}Sb_{22.2}Te_{55.6}$ ingot maintaining a purity of 99.999% (5N) was obtained. Subsequently, the high-purity Ag-doped $Ge_{22.2}Sb_{22.2}Te_{55.6}$ ingot was pulverized with a ball mill to prepare raw powder having an average grain size of approximately 30 μm, and a maximum grain size of approximately 90 μm (the values were round to the 10).

Subsequently, this raw powder was filled in a graphite die having a diameter of 400 mm, and processed by setting a final rising temperature of 600° C. at a temperature rising rate of 5° C./min, and a final pressing pressure of 150 kgf/cm² in a vacuum atmosphere of $8 \times 10^{-2}$ Pa or less in order to prepare an intermediate sintered compact of Ag-doped $Ge_{22}Sb_{22}Te_{56}$. The obtained intermediate sintered compact having a diameter of 400 mm was additionally subject to HIP treatment under the condition of $P_{HIP}$=1000 kgf/cm². The obtained final sintered compact was subject to cutting work to obtain a target material.

Consequently, in Reference Example 1, the average grain size of the sintered compact was 30 μm and the maximum grain size was 90 μm. A favorable target material was obtained.

The foregoing target material was bonded with a copper alloy backing plate to obtain a sputtering target. The electric resistivity of the target that was manufactured as described above was 0.26 mΩ·cm.

DC (direct current) magnetron sputtering was performed using this sputtering target. The DC (direct current) magnetron sputtering could be performed easily, and the sputtering rate was high. Even when power of 2000 W, which is greater than conventionally, was applied, the arcing generation rate was less than once per minute, and the particle generation rate was 18 particles or less and extremely low. Moreover, there was no occurrence of grain dropping or generation of nodules caused by micropores during sputtering.

With Reference Example 1, although there was no particular problem in the characteristics of the target in comparison to the foregoing Examples, an additional process of Ag doping is required, and there is a disadvantageous aspect of the production cost being high in comparison to the Examples.

Reference Example 2

The same raw powder as Reference Example 1 was used up to the pulverization process, and this raw powder was subject to heat treatment in the atmosphere to prepare a raw material having an oxygen content of 6000 ppm. The subsequent sintering conditions and final HIP treatment conditions were the same as Reference Example 1 for manufacturing a sputtering target. The electric resistivity of the target material manufactured as described above was 0.24 mΩ·cm. This target material was bonded with a copper alloy backing plate to obtain a sputtering target.

DC (direct current) magnetron sputtering was performed using this sputtering target. The DC (direct current) magnetron sputtering could be performed even easier than Reference Example 1, and the sputtering rate increased. Moreover, the particle generation rate was extremely low, and there was no occurrence of grain dropping or generation of nodules caused by micropores during sputtering. Accordingly, the DC (direct current) magnetron sputtering becomes easier to perform pursuant to the increase of oxygen, and the deposition rate also tends to increase.

Nevertheless, with Reference Example 2, similar to Reference Example 1, an additional process of Ag doping is required, and there is a disadvantageous aspect of the production cost being high in comparison to the Examples.

Reference Example 3

The same raw powder as Reference Example 1 was used up to the pulverization process, and this raw powder was subject to heat treatment in a high oxygen atmosphere to prepare a raw material having an oxygen content of 10000 ppm. The subsequent sintering conditions and final HIP treatment conditions were the same as Reference Example 1 for manufacturing a sputtering target. The electric resistivity of the target material manufactured as described above was 0.22 mΩ·cm. This target material was bonded with a copper alloy backing plate to obtain a sputtering target.

DC (direct current) magnetron sputtering was performed using this sputtering target. The DC (direct current) magnetron sputtering could be performed even easier than Reference Example 1 and Reference Example 2, and the sputtering rate increased considerably. Moreover, the particle generation rate was extremely low, and there was no occurrence of grain dropping or generation of nodules caused by micropores during sputtering.

Nevertheless, with Reference Example 3, similar to Reference Examples 1 and 2, an additional process of Ag doping is required, and there is a disadvantageous aspect of the production cost being high in comparison to the Examples.

Reference Example 4

The raw powders of Te, Sb and Ge respectively having a purity of 99.999% (5N) excluding gas components were mixed and melted to obtain a composition of $Ge_{22.2}Sb_{22.2}Te_{55.6}$ (at %), and slowly cooled in a furnace to prepare a cast ingot. The raw materials of the respective elements were subject to acid cleaning and deionized water cleaning prior to the melting process in order to sufficiently eliminate impurities remaining particularly on the surface. Consequently, a high-purity $Ge_{22.2}Sb_{22.2}Te_{55.6}$ ingot maintaining a purity of 99.999% (5N) was obtained.

Subsequently, the high-purity $Ge_{22.2}Sb_{22.2}Te_{55.6}$ ingot was pulverized with a ball mill to prepare raw powder having an average grain size of approximately 30 μm, and a maximum grain size of approximately 90 μm (the values were round to the 10). Next, this raw powder was subject to ion plating under the foregoing conditions to contain 1% of Ag, a sintered compact having a composition of $Ge_{22.2}Sb_{22.2}Te_{55.6}$ and a purity of 5N was obtained based on the same sintering conditions as Reference Example 1 other than the hot press retention temperature being changed to 420° C.; that is, by performing a vacuum hot press of $8 \times 10^{-2}$ Pa or less and HIP. Consequently, the average grain size of the sintered compact was 32 μm, and a favorable sintered compact was obtained.

The electric resistivity of the target material that was manufactured as described above was 0.24 mΩ·cm. This target material was bonded with a copper alloy backing plate to obtain a sputtering target. DC (direct current) magnetron sputtering was performed using this sputtering target. The DC (direct current) magnetron sputtering could be performed easily, and the sputtering rate was high. Even when power of 2000 W, which is greater than conventionally, was applied, the arcing generation rate was less than once per minute and the particle generation rate was 19 particles or less. The generation rate was extremely low. Moreover, there was no occurrence of grain dropping or generation of nodules caused by micropores during sputtering.

Nevertheless, with Reference Example 4, similar to Reference Examples 1, 2 and 3, an additional process of Ag doping is required, and there is a disadvantageous aspect of the production cost being high in comparison to the Examples.

Reference Example 5

3 wt % of In was added as a dopant and mixed with the same raw powder as Reference Example 1, this mixed powder was calcinated for 12 hours at 300° C. in the atmosphere, and intermediate sintering was performed with the same sintering conditions and the final HIP treatment conditions as Reference Example 1 to manufacture a similar sputtering target. The electric resistivity of the target material that was manufactured as described above was 0.55 mΩ·cm. Moreover, the oxygen content was measured and the result was 1900 wtppm. This target material was bonded with a copper alloy backing plate to obtain a sputtering target.

When DC (direct current) magnetron sputtering was performed using this sputtering target with power of 2000 W, which is greater than conventionally, the particle generation rate was high, and grain dropping and generation of nodules caused by oxide grains with no conductivity were observed from the initial stages of sputtering. Moreover, macro patterns occurred on the target surface after being used in sputtering, and the cause thereof is considered to be the rise in temperature.

Accordingly, DC (direct current) magnetron sputtering resulted in low electric conduction and low thermal conduction unless the raw powder treatment according to the present invention is performed, and it was not possible to resolve the problems.

Comparative Example 1

The raw powders of Te, Sb and Ge respectively having a purity of 99.999% (5N) excluding gas components were mixed and melted to obtain a composition of $Ge_{22.2}Sb_{22.2}Te_{55.6}$ (at %), and a cast ingot was prepared. Here, no element (Ag, for instance) was doped. The raw materials of the respective elements were subject to acid cleaning and deionized water cleaning prior to the melting process in order to sufficiently eliminate impurities remaining particularly on the surface.

Consequently, a high-purity $Ge_{22.2}Sb_{22.2}Te_{55.6}$ ingot maintaining a purity of 99.999% (5N) was obtained. Subsequently, the high-purity $Ge_{22.2}Sb_{22.2}Te_{55.6}$ ingot was pulverized with a ball mill in an inert atmosphere to prepare raw powder having an average grain size of approximately 30 μm, and a maximum grain size of approximately 90 μm (the values were round to the 10). The foregoing conditions were the same as Example 1.

Subsequently, this raw powder was subject to hydrogen reduction and thereafter filled in a graphite die having a diameter of 400 mm, and it was processed by setting a final rising temperature of 600° C. at a temperature rising rate of 15° C./min, and a final pressing pressure of 150 kgf/cm² in an inert atmosphere in order to prepare an intermediate sintered compact of $Ge_{22.2}Sb_{22.2}Te_{55.6}$. And, the intermediate sintered compact was subject to HIP to prepare a final sintered compact. The oxygen concentration of this sintered compact was 350 ppm. Consequently, a sintered compact having an average grain size of 30 μm was obtained.

The thermal conductivity of the target material manufactured as described above was 2.4 W/mK, and the electric resistivity was 0.50 mΩ·cm. This target material was bonded with a copper alloy backing plate to obtain a sputtering target. DC (direct current) magnetron sputtering was performed using this sputtering target with power of 2000 W, which is greater than conventionally. Consequently, arcing occurred three times per minute on average, and it was not possible to resolve the problem.

Comparative Example 2

The same raw powder as Example 1 was used up to the pulverizing process, and this raw powder was subject to hydrogen reduction treatment to prepare a raw material having an oxygen content of 280 ppm. Here, no element (Ag, for instance) other than oxygen was doped. The subsequent sintering conditions and final HIP treatment conditions were the same as Example 1 for manufacturing a sputtering target. The thermal conductivity of the target material manufactured as described above was 2.2 W/mK, and the electric resistivity was 0.42 mΩ·cm. This target material was bonded with a copper alloy backing plate to obtain a sputtering target.

When DC (direct current) magnetron sputtering was performed using this sputtering target, arcing occurred once per minute on average, and macro patterns partially occurred on the target surface after being used in sputtering. The cause thereof is considered to be the rise in temperature.

Comparative Example 3

The same raw powder as Example 4 was used up to the pulverizing process, and this raw powder was subject to heat treatment for 24 hours at 450° C. in an oxygen atmosphere to prepare a raw material having an oxygen content of 10%. Here, no element (Ag, for instance) other than oxygen was doped. The subsequent sintering conditions and final HIP treatment conditions were the same as Example 4 for manufacturing a sputtering target. The thermal conductivity of the target material manufactured as described above was 1.2 W/mK, and the electric resistivity was 10 mΩ·cm. The relative density was low at 79%. This target material was bonded with a copper alloy backing plate to obtain a sputtering target.

DC (direct current) magnetron sputtering was performed using this sputtering target but was unstable since the resistivity of the target was high. Since arcing occurred frequently at ten times per minute during the sputtering process and it became difficult to continue sputtering, there was no choice but to discontinue the sputtering process. The sputtering target was thereafter removed from the sputtering device and observed, and the target material had cracked. The particle generation rate was 100 particles and was extremely high, and grain dropping and generation of nodules caused by micropores during sputtering were observed considerably.

Comparative Example 4

The same raw powder as Example 1 was used up to the pulverizing process, and this raw powder was oxidized by being subject to heat treatment for 1 hour at 350° C. in the atmosphere (oxygen concentration: 20.90%). The oxygen content of the raw powder was 4000 wtppm. The subsequent sintering conditions and final HIP treatment conditions were the same as Example 1 for manufacturing a sputtering target.

The thermal conductivity of the target material manufactured as described above was 2.4 W/mK, and the electric resistivity was 0.31 mΩ·cm. This target material was bonded with a copper alloy backing plate to obtain a sputtering target.

DC (direct current) magnetron sputtering was performed using this sputtering target. The sputtering rate of the DC (direct current) magnetron sputtering was inferior in comparison to Example 1.

The arcing generation rate was twice per minute and the particle generation rate was 29 particles. The particle generation rate was high, and grain dropping and generation of nodules caused by micropores during sputtering were also observed. Accordingly, the DC (direct current) magnetron sputtering becomes difficult unless the oxygen content has reached its defined amount, and the deposition rate tends to decrease.

Comparative Example 5

The same raw powder as Example 4 was used up to the pulverization process, and this raw powder was subject to heat treatment for 60 hours at 350° C. in a high oxygen atmosphere (oxygen concentration in the atmosphere was increased so as to achieve an oxygen concentration of 50%). The oxygen content of the raw powder was 30000 wtppm.

The subsequent sintering conditions and final HIP treatment conditions were the same as Example 4 for manufacturing a sputtering target. The thermal conductivity of the target material manufactured as described above was 2.1 W/mK, and the electric resistivity was 0.36 mΩ·cm. This target material was bonded with a copper alloy backing plate to obtain a sputtering target.

DC (direct current) magnetron sputtering was performed using this sputtering target. The DC (direct current) magnetron sputtering was rather inferior in comparison to Example 4, and the sputtering rate also decreased.

The arcing generation rate was less than twice per minute, and the particle generation rate was 33 particles or less. The particle generation rate was high, and grain dropping and generation of nodules caused by micropores during sputtering were observed.

Comparative Example 6

The same raw powder as Example 5 was used up to the pulverization process, and this raw powder was oxidized by being subject to heat treatment for 1 hour at 300° C. in the atmosphere (oxygen concentration: 20.90%). The oxygen content of the raw powder was 4000 wtppm. The subsequent sintering conditions and final HIP treatment conditions were the same as Example 5 for manufacturing a sputtering target.

The thermal conductivity of the target material manufactured as described above was 2.3 W/mK, and the electric resistivity was 0.38 mΩ·cm. This target material was bonded with a copper alloy backing plate to obtain a sputtering target.

DC (direct current) magnetron sputtering was performed using this sputtering target. The DC (direct current) magnetron sputtering was difficult to perform in comparison to Example 5, and the sputtering rate decreased.

The arcing generation rate was three times per minute and the particle generation rate was 30 particles. The particle generation rate was high, and grain dropping and generation of nodules caused by micropores during sputtering were observed. Accordingly, the DC (direct current) magnetron sputtering becomes difficult pursuant to the decrease of oxygen, and the deposition rate tends to decrease.

Comparative Example 7

The same raw powder as Example 8 was used up to the pulverization process, and this raw powder was subject to heat treatment for 60 hours at 300° C. in a high oxygen atmosphere (oxygen concentration in the atmosphere was increased so as to achieve an oxygen concentration of 50%). The oxygen content of the raw powder was 30000 wtppm.

The subsequent sintering conditions and final HIP treatment conditions were the same as Example 8 for manufacturing a sputtering target. The thermal conductivity of the target material manufactured as described above was 2.1 W/mK, and the electric resistivity was 0.4 mΩ·cm. This target material was bonded with a copper alloy backing plate to obtain a sputtering target.

DC (direct current) magnetron sputtering was performed using this sputtering target. The sputtering rate of the DC (direct current) magnetron sputtering was rather difficult in comparison to Example 8, and the sputtering rate decreased.

The arcing generation rate was ten times per minute and the particle generation rate was 80 particles. The particle generation rate was extremely high, and grain dropping and generation of nodules caused by micropores during sputtering were observed.

Comparative Example 8

The same raw powder as Example 8 was used up to the pulverization process, and this raw powder was subject to heat treatment for 24 hours at 300° C. in an oxygen atmosphere. The oxygen content of the raw powder was 10 wt %.

The subsequent sintering conditions and final HIP treatment conditions were the same as Example 8 for manufacturing a sputtering target. The thermal conductivity of the target material manufactured as described above was 1 W/mK, and the electric resistivity was 0.56 mΩ·cm. This target material was bonded with a copper alloy backing plate to obtain a sputtering target.

DC (direct current) magnetron sputtering was performed using this sputtering target but was unstable since the resistivity of the target was high. Since arcing occurred frequently at fifteen times per minute during the sputtering process and it became difficult to continue sputtering, there was no choice but to discontinue the sputtering process.

The sputtering target was thereafter removed from the sputtering device and observed, and the target material had cracked. The particle generation rate was 250 particles and was extremely high, and grain dropping and generation of nodules caused by micropores during sputtering were observed considerably.

In the present invention, the raw material treatment and sintering conditions were devised for manufacturing, for example, a sintered compact for a Ge—Sb—Te-based material target, and the sintered compact was to have a low resistivity by forming low-resistance crystal phases at the grain boundary. Thereby, thermal conductivity of 2.5 W/mK or more and electric resistivity of 0.30 mΩ·cm or less could be achieved, and the present invention has realized a target of sintered compact with high electric conductivity and high thermal conductivity.

This kind of low-resistance sputtering target is effective as a material for phase-change recording; that is, as a medium for recording information by using phase transformation. For example, when a thin film of Ge—Sb—Te-based material is formed, the present invention has superior effects such that: a target that is free from heat accumulation inside the target and diffusion of volatile components can be obtained; stable DC sputtering and high-speed sputtering by applying high power can be performed; the generation of arcing during sputtering and the generation of particles can be reduced; the deposition quality and the production efficiency can be improved; and a film of a phase-change recording material comprising the material uniformity can be formed.

The invention claimed is:

1. A target of sintered compact consisting of:
one or more chalcogenide elements (A) selected from the group consisting of S, Se, and Te,
one or more Vb-group elements (B) selected from the group consisting of Bi, Sb, As, P, and N,
one or more IVb-group elements or IIIb-group elements (C) selected from the group consisting of Ge, Si, C, Ga, and In, and
oxygen in an amount of 5000 wtppm or more,
wherein the target has a thermal conductivity of 2.5 W/mK or more and a structure including oxygen-deficient suboxide crystal phases of low resistance at grain boundaries within the target, and wherein the oxygen-deficient suboxide crystal phases are a suboxide of one or more elements of which the target is made.

2. The target of sintered compact according to claim 1, wherein the amount of oxygen is 5000 wtppm or more and 30000 wtppm or less.

3. The target of sintered compact according to claim 1, wherein the amount of oxygen is 5000 wtppm or more and 15000 wtppm or less.

4. The target of sintered compact according to claim 3, wherein the chalcogenide element (A) is Te, the Vb-group element (B) is Sb, the IVb-group or IIIb-group element (C) is Ge, and wherein the target has a composition of elements excluding oxygen expressed as $Ge_{22.2}Sb_{22.2}Te_{55.6}$ (at %) and an electric resistivity of 0.30 mΩ·cm or less.

5. The target of sintered compact according to claim 4, wherein the electric resistivity is 0.26 mΩ·cm or less.

6. The target of sintered compact according to claim 4, wherein the electric resistivity is 0.24 mΩ·cm or less.

7. The target of sintered compact according to claim 4, wherein the electric resistivity is 0.22 mΩ·cm or less.

8. The target of sintered compact according to claim 7, wherein the thermal conductivity is 3.0 W/mK or more.

9. The target of sintered compact according to claim 7, wherein the thermal conductivity is 3.2 W/mK or more.

10. The target of sintered compact according to claim 7, wherein the thermal conductivity is 3.4 W/mK or more.

11. A deposition method to form a film on a substrate comprising the step of DC sputtering a target of a sintered compact consisting of one or more of S, Se, and Te, one or more of Bi, Sb, As, P, and N, one or more of Ge, Si, C, Ga, and In, and an oxygen concentration of 5000 wtppm or more, and wherein the target has a thermal conductivity of 2.5 W/mK or more and a structure including oxygen-deficient suboxide crystal phases of low resistance at grain boundaries within the target, and wherein the oxygen-deficient suboxide crystal phases are a suboxide of one or more elements of which the target is made.

12. The target of sintered compact according to claim 1, wherein the chalcogenide element (A) is Te, the Vb-group element (B) is Sb, the IVb-group or IIIb-group element (C) is Ge, and wherein the target has a composition of elements, excluding oxygen, expressed as $Ge_{22.2}Sb_{22.2}Te_{55.6}$ (at %) and an electric resistivity of 0.30 mΩ·cm or less.

13. The target of sintered compact according to claim 12, wherein the electric resistivity is 0.26 mΩ·cm or less.

14. The target of sintered compact according to claim 12, wherein the electric resistivity is 0.24 mΩ·cm or less.

15. The target of sintered compact according to claim 12, wherein the electric resistivity is 0.22 mΩ·cm or less.

16. The target of sintered compact according to claim 1, wherein the thermal conductivity is 3.0 W/mK or more.

17. The target of sintered compact according to claim 1, wherein the thermal conductivity is 3.2 W/mK or more.

18. The target of sintered compact according to claim 1, wherein the thermal conductivity is 3.4 W/mK or more.

19. A sintered compact target having a composition consisting of Te, Sb, Ge, and 5000 wtppm or more of oxygen, wherein the composition excluding oxygen is expressed as $Ge_{22.2}Sb_{22.2}Te_{55.6}$ (at %), and wherein the target has an electric resistivity of 0.30 mΩ·cm or less, a thermal conductivity of 2.5 W/mK or more, and a structure having an average grain size of 1 to 100 μm and including oxygen-deficient $GeO_x$ suboxide crystal phases of low resistance at grain boundaries.

* * * * *